(12) United States Patent
    Banhegyesi

(10) Patent No.: US 8,269,482 B2
(45) Date of Patent: Sep. 18, 2012

(54) INTELLIGENT ELECTRONIC DEVICE HAVING CIRCUITRY FOR REDUCING THE BURDEN ON CURRENT TRANSFORMERS

(75) Inventor: Tibor Banhegyesi, Baldwin, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 492 days.

(21) Appl. No.: 12/211,384

(22) Filed: Sep. 16, 2008

(65) Prior Publication Data

US 2009/0072813 A1    Mar. 19, 2009

Related U.S. Application Data

(60) Provisional application No. 60/994,453, filed on Sep. 19, 2007.

(51) Int. Cl.
    *G01R 15/18* (2006.01)
    *G01R 1/20* (2006.01)
    *G01R 15/20* (2006.01)
    *G01R 19/20* (2006.01)

(52) U.S. Cl. ............ 324/127; 324/117 R; 324/126

(58) Field of Classification Search ............ None
    See application file for complete search history.

(56) References Cited

U.S. PATENT DOCUMENTS

| | | | |
|---|---|---|---|
| 3,534,247 A | 10/1970 | Miljanic | |
| 3,815,013 A * | 6/1974 | Milkovic | 323/357 |
| 3,995,210 A | 11/1976 | Milkovic | |
| 4,140,952 A | 2/1979 | Miller | |
| 4,495,463 A | 1/1985 | Milkovic | |
| 4,841,236 A | 6/1989 | Miljanic et al. | |
| 5,006,846 A * | 4/1991 | Granville et al. | 340/870.28 |
| 5,220,495 A | 6/1993 | Zulaski | |
| 5,438,257 A | 8/1995 | Berkcan | |
| 5,459,395 A | 10/1995 | Berkcan | |
| 5,568,047 A | 10/1996 | Staver et al. | |
| 5,952,819 A | 9/1999 | Berkcan et al. | |
| 6,018,700 A | 1/2000 | Edel | |
| 6,023,160 A | 2/2000 | Coburn | |
| 6,417,661 B1 | 7/2002 | Berkcan et al. | |
| 6,433,981 B1 | 8/2002 | Fletcher et al. | |
| 6,479,976 B1 * | 11/2002 | Edel | 323/357 |
| 6,522,517 B1 * | 2/2003 | Edel | 361/143 |
| 6,590,380 B2 * | 7/2003 | Edel | 324/127 |
| 6,671,635 B1 | 12/2003 | Forth et al. | |
| 6,963,195 B1 | 11/2005 | Berkcan | |
| 7,174,261 B2 | 2/2007 | Gunn et al. | |
| 7,304,829 B2 | 12/2007 | Nadipuram et al. | |

* cited by examiner

*Primary Examiner* — Roberto Velez

(74) *Attorney, Agent, or Firm* — Gerald E. Hespos; Michael J. Porco

(57) ABSTRACT

An intelligent electronic device (IED), e.g., an electrical power meter, having circuitry for reducing the burden placed on at least one current sensor of the device resulting in a highly accurate measurement by the at least one current sensor is provided. The circuitry of the present disclosure reduces the burden on the current sensor while providing amplification, e.g., gain control, to the input signal. The circuitry includes at least one current sensor outputting a signal to an operational amplifier (op amp) having a controlled variable feedback resistance. By employing an operational amplifier in the circuitry, the output of the current sensor will be at a near zero volts condition at all times thus reducing the burden on the current sensor.

17 Claims, 3 Drawing Sheets

INTELLIGENT ELECTRONIC DEVICE HAVING CIRCUITRY FOR REDUCING THE BURDEN ON CURRENT TRANSFORMERS

PRIORITY

This application claims priority to U.S. Provisional Patent Appl. No. 60/994,453, filed Sep. 19, 2007, the contents of which are hereby incorporated by reference in its entirety.

BACKGROUND

1. Field

The present disclosure relates generally to intelligent electronic devices (IEDs) for electrical power systems, and more particularly, to an intelligent electronic device having circuitry for reducing the burden placed on at least one current sensor of the device resulting in a highly accurate measurement by the at least one current sensor.

2. Description of the Related Art

Electric utility companies ("utilities") track electric usage by customers by using power meters, also known as IEDS. These meters track the amount of power consumed at a particular location. These locations range from power substations, to commercial businesses, to residential homes. The electric utility companies use information obtained from the power meter to charge its customers for their power consumption, i.e., revenue metering.

A popular type of power meter is the socket-type power meter, i.e., S-base or Type S meter. As its name implies, the meter itself plugs into a socket for easy installation, removal and replacement. Other meter installations include panel mounted, switchboard mounted, and circuit breaker mounted. Additional meter forms include switchboard drawout forms, substation panel metering forms, and A-base front wired forms. Typically, the power meter connects between utility power lines supplying electricity and a usage point, namely, a residence or commercial place of business.

A power meter may also be placed at a point within the utility's power grid to monitor power flowing through that point for distribution, power loss, or capacity monitoring, e.g., a substation. These power and energy meters are installed in substations to provide a visual display of real-time data and to alarm when problems occur. These problems include limit alarms, breaker control, outages and many other types of events. Conventionally, the visual display includes numerical information and/or an alarm indication, e.g., a LED, on the face of the meter.

To determine power consumed in a system, a power meter measures or senses current and voltage of at least one phase of the power distribution system. Sensors employed in such systems include current sensors, current transformers (CTs), etc. for measuring current and voltage transformers, potential transformers (PTs), etc. for measuring voltage. Conventional sensors have an instability problem in transferring a measured signal from the primary side of a transformer to the secondary side. This behavior is inherent to current transformers and is directly related to the burden placed on the transformer, i.e., the value of the load resistance on the secondary winding. The instability is responsible for phase response shifts due to aging, temperature or mechanical stress of the transformer core. The aforementioned conditions can cause unpredictable errors in the power measurements at lower power factor conditions.

Existing measurement circuits in power meters rely on the quality of the CT's core material for stable signal transfer and only a narrow tolerance range is accepted. These circuits also yield limited dynamic range for the required accuracy performance. Techniques using post gain switching, as shown in FIG. 1, give marginal improvement due to the amplification of noise and distortion already present on the usable signal Isec at the output of the CT, across the load resistor Rload.

Therefore, there is an increasing demand in the electrical metering industry for devices, such as electrical power meters, analyzers, etc., to be able to measure AC current and its related parameters, e.g., power, energy, power factor, etc., with higher dynamic range and higher precision.

SUMMARY

An intelligent electronic device (IED), e.g., an electrical power meter, having circuitry for reducing the burden placed on at least one current sensor of the device resulting in a highly accurate measurement by the at least one current sensor is provided. A current sensor can also include a current sensing circuit as part of the current sensor. The circuitry of the present disclosure reduces the burden on the current sensor while providing amplification, e.g., gain control, to the input signal. The circuitry includes at least one current sensor outputting a signal to an operational amplifier (op amp) having a controlled variable feedback resistance. By employing an operational amplifier in the circuitry, the output of the current sensor will be at a near zero volts condition at all times thus reducing the burden on the current sensor. Furthermore, the near zero volts conditions will be unaffected by varying the feedback resistance to the operational amplifier thus keeping the burden of the current sensor constant while providing amplification of the signal.

According to one aspect of the present disclosure, a current sensor is provided including a transformer including a primary winding configured for sensing a current delivered to a load and a secondary winding configured for outputting a scaled current; and an amplification circuit configured for variably amplifying the scaled output current and maintaining the output of the secondary winding at near zero voltage. The amplification circuit includes an operational amplifier, an input of the operational amplifier being coupled across the output of the secondary winding.

In another aspect, the amplification circuit includes a variable feedback resistance coupled to the input of the operational amplifier, wherein the variable feedback resistance includes at least one first resistor, at least one second resistor and at least one switch for selectively coupling the at least one first resistor or at least one second resistor to the input of the operational amplifier.

In a further aspect, an output signal (Vout) of the amplification circuit is $$Vout = Rfb * Ipr/Rct$$

where Rfb is the variable feedback resistance, Ipr is the current delivered to the load and Rct is a transfer ratio of the transformer.

According to another aspect, a current sensor includes a transformer including a primary winding configured for sensing a current delivered to a load and a secondary winding configured for outputting a scaled current; an operational amplifier coupled across the output of the secondary winding and configured for maintaining the output of the secondary winding at near zero voltage condition; and a variable feedback resistance coupled to the input of the operational amplifier configured for variably amplifying the scaled output current.

According to yet another aspect of the present disclosure, an intelligent electronic device is provided including a transformer including a primary winding configured for sensing a current delivered to a load and a secondary winding configured for outputting a scaled current; an amplification circuit configured for variably amplifying the scaled output current and maintaining the output of the secondary winding at near zero voltage; at least one analog-to-digital converter configured for receiving the amplified output and converting the amplifier output to a digital signal; and a processor configured to receive the digital signal and determine a value for the current delivered to the load.

In another aspect, the processor is further configured to generate a control signal for controlling the variable amplification of the scaled current.

In a further aspect, the amplification circuit includes an operational amplifier, an input of the operational amplifier being coupled across the output of the secondary winding wherein the amplification circuit includes a variable feedback resistance coupled to the input of the operational amplifier.

In yet another aspect, the variable feedback resistance includes at least one first resistor, at least one second resistor and at least one switch for selectively coupling the at least one first resistor or at least one second resistor to the input of the operational amplifier and the processor is configured to monitor an output of the operational amplifier and, if the output of the operational amplifier is less than a predetermined threshold, to switch between the at least one first resistor and the at least one second resistor to provide amplification of the output of the operational amplifier.

The above and other aspects, features, and advantages of the present disclosure will become more apparent in light of the following detailed description when taken in conjunction with the accompanying drawings.

Figure 1:
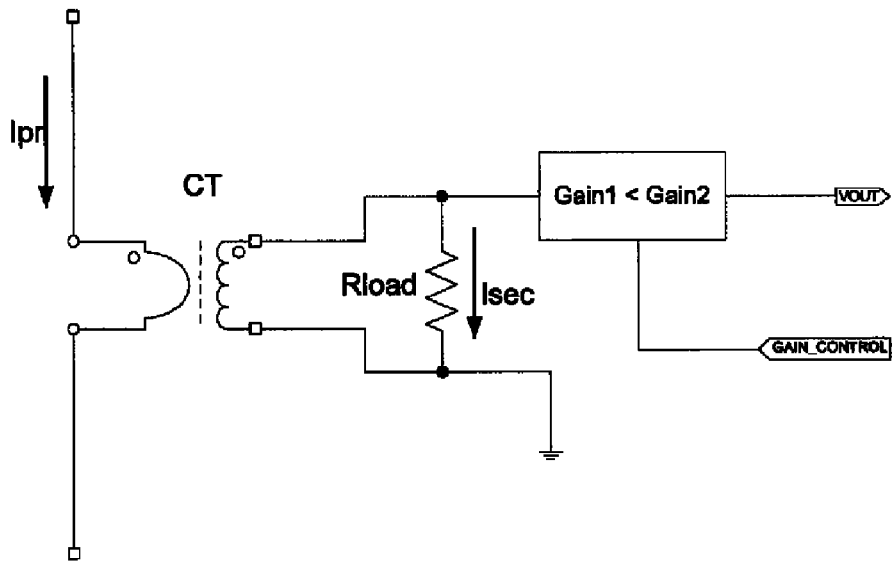
FIG. 1 is a diagram of a prior art gain switching circuit employed with a current transformer of a power meter.

To facilitate understanding, identical reference numerals have been used, where possible, to designate identical elements that are common to the figures, except that alphanumerical suffixes may be added, when appropriate, to differentiate such elements. The images in the drawings are simplified for illustrative purposes and are not depicted to scale.

The appended drawings illustrate exemplary embodiments of the present disclosure and, as such, should not be considered as limiting the scope of the disclosure that may admit to other equally effective embodiments. Correspondingly, it has been contemplated that features or steps of one embodiment may beneficially be incorporated in other embodiments without further recitation.

In some embodiments, particular method steps of the discussed methods are performed in the depicted order. In alternate embodiments, in the respective methods, at least two method steps or portions thereof may be performed contemporaneously, in parallel, or in a different order.

DETAILED DESCRIPTION

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces, programmable logic or other device or devices.

The present description illustrates the principles of the present disclosure. It will thus be appreciated that those skilled in the art will be able to devise various arrangements that, although not explicitly described or shown herein, embody the principles of the disclosure and are included within its spirit and scope.

All examples and conditional language recited herein are intended for pedagogical purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, state transition diagrams, pseudo-code, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read only memory ("ROM") for storing software, random access memory ("RAM"), and nonvolatile storage, programmable logic or other device or devices.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

Aspects of the present disclosure are illustratively described herein within the context of intelligent electronic devices ("IEDs") such as power quality analyzers, including portable and accuracy certifiable power quality analyzers. The term "power quality analyzers" is broadly used herein in reference to IEDs adapted to record, measure, and communicate at least some of parameters of waveforms of voltages and currents of a respective electrical service, including their harmonics, transients, ripples, and other disturbances. The term "portable" is used in reference to the power quality analyzers to denote transportability of such IEDs and ability thereof for momentarily, temporary, and permanent connectivity to respective electrical services and communication networks.

It will be appreciated by those skilled in the art that the disclosure may also be utilized within the context of other IEDs, including Programmable Logic Controllers (PLC's), Remote Terminal Units (RTUs), protective relays, fault recorders, and meters, among other devices or systems used to manage and control quality, distribution, and consumption of electrical power.

The word "exemplary" is used herein to mean "serving as an example, instance, or illustration." Any configuration or design described herein as "exemplary" is not necessarily to be construed as preferred or advantageous over other configurations or designs. Herein, the phrase "coupled with" is defined to mean directly connected to or indirectly connected with through one or more intermediate components. Such intermediate components may include both hardware and software based components.

Figure 3:
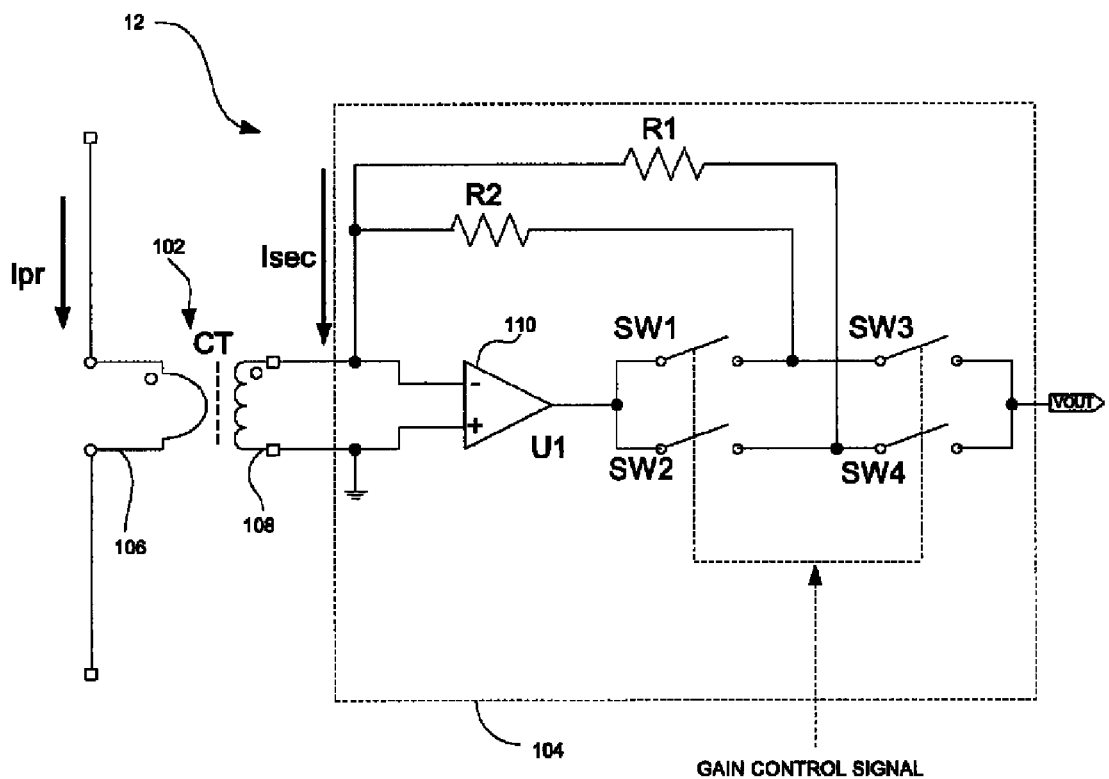
FIG. 3 is a diagram of a circuit for reducing the burden placed on at least one current sensor of an intelligent electronic device in accordance with an embodiment of the present disclosure.
Figure 2:
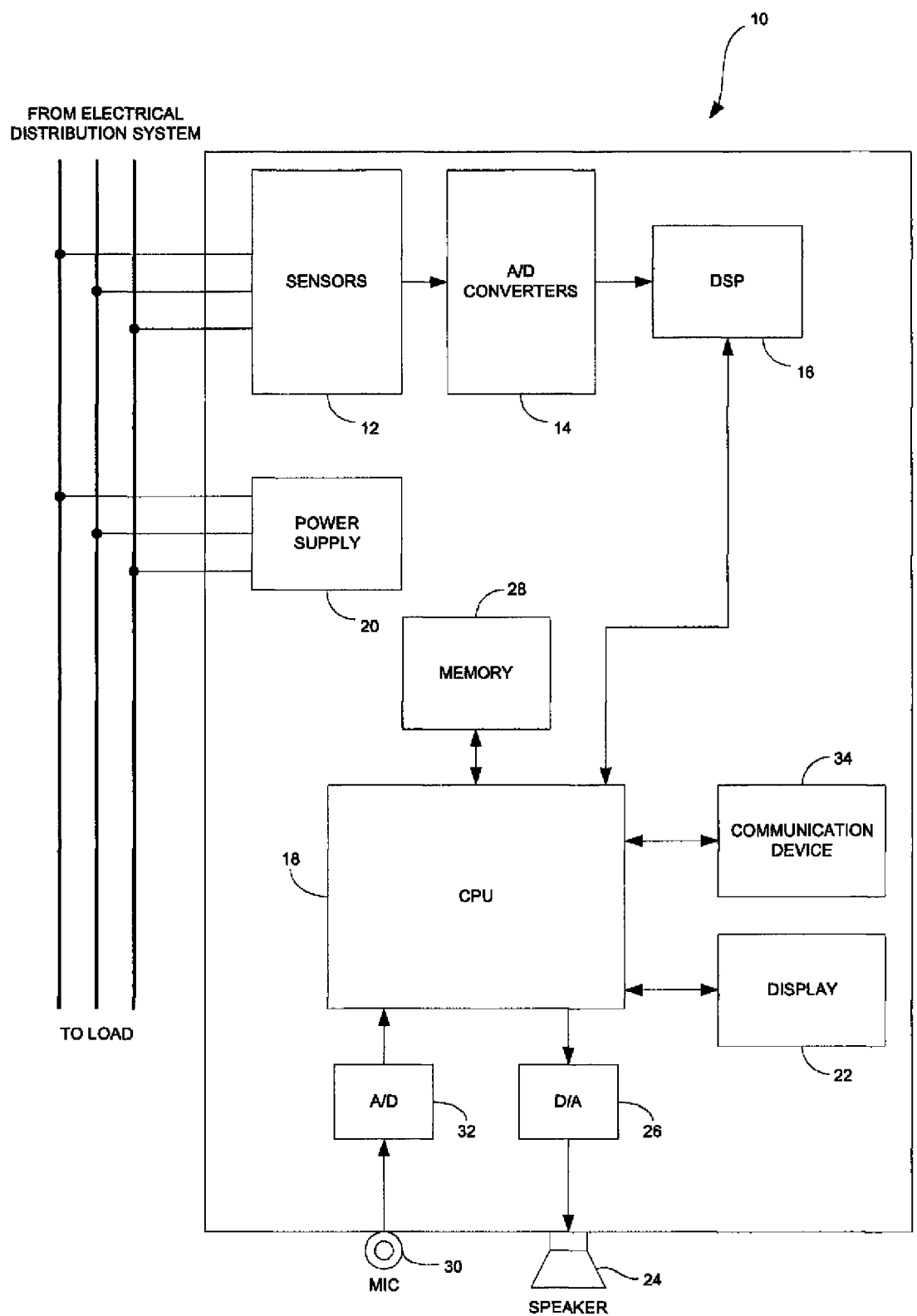
FIG. 2 is a diagram of an intelligent electronic device in accordance with an embodiment of the present disclosure.

An intelligent electronic device (IED) 10 for monitoring and determining an amount of electrical power usage by a consumer and for providing audible and visual indications to a user is illustrated in FIG. 2. Generally, the IED 10 includes sensors 12, a plurality of analog-to-digital (A/D) converters 14 and a processing system including a central processing unit (CPU) 18 and/or a digital signal processor (DSP) 16. The sensors 12 will sense electrical parameters, e.g., voltage and current, of the incoming lines from an electrical power distribution system, e.g., an electrical circuit. Preferably, the sensors will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. An exemplary current sensor 12 is shown in FIG. 3 including current transformer 102 and circuitry 104. A primary winding 106 of the current transformer 102 senses current to a load Ipr and secondary winding 108 outputs a scaled current Isec to circuitry 104. The output VOUT of circuitry 104 will be coupled to the A/D converters 14 configured to convert the analog output voltage from the transformer to a digital signal that can be processed by the CPU 18 or DSP 16.

Referring to FIG. 3, at least one sensor 12 will include a current transformer 102 and circuitry 104 for ensuring the accuracy of the at least one current transformer 102. To minimize the accuracy degradation by the burden placed on the at least one current transformer 102, circuit 104 will be used to take over the load from the at least one current transformer 102. This can be achieved by insuring near zero voltage on the output of the at least one current transformer 102, i.e., the secondary winding 108.

Circuitry 104 includes an operational amplifier 110 which inputs are connected across the secondary winding 108 of the current transformer 102. An exemplary operational amplifier is commercially available as Model AD822 from Analog Devices, Inc. of Norwood, Mass. By employing an operational amplifier 110 in the circuitry 104, the output of the current sensor 102 will be at a near zero volts condition at all times thus reducing the burden on the current sensor 102. Furthermore, the near zero volts conditions will be unaffected by varying the feedback resistance to the operational amplifier 110 thus keeping the burden of the current sensor 102 constant while providing amplification of the signal.

A plurality of switches SW1, SW2, SW3, SW4 are employed to change the feedback resistance to the operational amplifier 110 providing additional boost or amplification for the output signal VOUT if necessary. It is to be appreciated that the switches operate in pairs, for example, switch SW1 and SW3 will operate to include or remove feedback resistor R2 and switch SW2 and SW4 will operate to include or remove feedback resistor R1. The switches state is controlled by a microprocessor and is based on the output signal VOUT. It is to be appreciated CPU 18 may control the switches or a separate microprocessor may be provided.

It is to be appreciated that exemplary switches will include semiconductor analog type switches packaged in one device. However, other conventional types of switches may be employed. It is further to be appreciated that the output accuracy of the operational amplifier will not be affected by the impedance of any of the switches as long as the following stage has large input impedance, e.g., a buffer, a filter, signal conditioning circuitry, etc.

In other embodiment, the plurality of switches SW1, SW2, SW3, SW4 and resistors R1 and R2 may be replaced with a single variable resistor coupled across the output of the operational amplifier 110 and the negative input terminal of the operational amplifier 110. The variable resistor can be adjusted to any one of a plurality of resistor values or can be switched between two resistor values to simulate the effect of resistors R1 and R2 described above.

The output voltage VOUT of circuitry 104 can be described as follows:

$$VOUT = Rfb * Ipr / Rct \qquad (1)$$

where Rfb is the feedback resistor R1 or R2 being used in the circuit; Ipr is the primary current and Rct is the transformer transfer ratio Ipr/Isec. CPU 16 or DSP 18 will control the variable feedback to maintain the output of the operational amplifier at a proper level via a gain control signal. The CPU 16 or DSP 18 will monitor the output of the operational amplifier and, if the output is less than a predetermined threshold, the CPU 16 or DSP 18 will generate a gain control signal to operate the switches to change the feedback to the operational amplifier to provide a boost or amplification of the output signal VOUT.

To illustrate circuitry 104 operation, assume the current transformer ratio Rct is 1000:1, resistor R1 is 100 ohms and resistor R2 is 1 k ohms. For a normal current signal, i.e., Ipr is greater than 1 amp, switches SW2, SW4 are closed, switches SW1, SW3 are open and resistor R1 is the feedback resistor. For example, if Ipr is 10 amps, VOUT is 1 volt. For lower current input, e.g., when the input current fall below a predetermined threshold, the output voltage VOUT can be increased by setting switches SW2, SW4 open, switches SW1, SW3 closed and using feedback resistor R2. In this case, a primary current Ipr of 1 amp will still result in an output voltage VOUT of 1 volt. By employing the circuitry 104 of the present disclosure, the input current can be amplified while maintaining a near zero voltage at the secondary winding 108 of the current transformer 102 thus reducing the burden on the current transformer 102. This method of amplification ensures constant and very low burden for the current transformer 102, regardless of the state of the switches or amplification.

The CPU 18 is configured for receiving the digital signals from the A/D converters 14 to perform the necessary calculations to determine the power usage and controlling the overall operations of the IED 10. In another embodiment, the DSP 16 will receive the digital signals from the A/D converters 14 and perform the necessary calculations to determine the power usage to free the resources of the CPU 18. It is to be appreciated that in certain embodiments the CPU 18 may perform all the functions performed by the CPU 18 and DSP 16, and therefore, in these embodiments the DSP 16 will not be utilized.

A power supply 20 is also provided for providing power to each component of the IED 10. In one embodiment, the power supply 20 is a transformer with its primary windings coupled to the incoming power distribution lines and having an appropriate number of windings to provide a nominal voltage, e.g., 5 VDC, at its secondary windings. In other embodiments, power is supplied from an independent source to the power supply 20, e.g., from a different electrical circuit, a uninterruptible power supply (UPS), etc.

The IED 10 of the present disclosure will have user interface for interacting with a user and for communicating events, alarms and instructions to the user. The user interface will include a display 22 for providing visual indications to the user. The display 22 may include a touch screen, a liquid crystal display (LCD), a plurality of LED number segments, individual light bulbs or any combination of these. The display 22 may provide the information to the user in the form of alpha-numeric lines, computer-generated graphics, videos, etc. Visual information provided on the display 22 may include but is not limited to instructional videos, operating manuals associated with an IED, a flowchart for troubleshooting, a checklist for troubleshooting, etc. Digital files including the various visual instructions are stored in either memory 28 or retrieved from a remote event server.

The user interface will also include an audible output device 24, e.g., a speaker. The speaker 24 will be coupled to the CPU 18 via a digital-to-analog converter (D/A) 26 for converting digital audio files stored in memory 28 to analog signals playable by the speaker 22. The audible output device 24 may simply provide audible instructions to a user when an event is detected or may provided audio with a corresponding video being displayed on the display 22.

The device 100 of the present disclosure will support various file types including but not limited to Microsoft Windows Media Video files (.wmv), Microsoft Photo Story files (.asf), Microsoft Windows Media Audio files (.wma), MP3 audio files (.mp3), JPEG image files (.jpg, .jpeg, .jpe, .jfif), MPEG movie files (.mpeg, .mpg, .mpe, .m1v, .mp2v .mpeg2), Microsoft Recorded TV Show files (.dvr-ms), Microsoft Windows Video files (.avi) and Microsoft Windows Audio files (.wav).

The memory 28 is configured for storing the files including the visual and/or audible instructions. The memory 28 includes internal storage memory, e.g., random access memory (RAM), or removable memory such as magnetic storage memory; optical storage memory, e.g., the various known types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded with new instruction files as needed.

In one embodiment, the digital audio files may be programmed directly through the IED 10. In this embodiment, the IED 10 will include an audio input device 30, e.g., a microphone, for receiving spoken words in the form of analog signals. The analog signals will then be sent to an analog-to-digital converter (A/D) 32 to convert the analog signals into digital signals understandable by the CPU 18. The CPU 18 will then store the recorded digital audio file in the memory 28. The user may associate the recorded digital file with a particular alarm through the touch screen display 22. Alternatively, the user may associate the recorded digital file with an event code.

In a further embodiment, the IED 10 will include a communication device 34 for enabling communications between the IED 10 and other computing devices, e.g., a desktop computer, laptop computer, other IEDs, etc. The communication device 34 may be a modem, network interface card (NIC), wireless transceiver, etc. The communication device 34 will perform its functionality by hardwired and/or wireless connectivity. The hardwire connection may include but is not limited to hard wire cabling e.g., parallel or serial cables, USB cable, Firewire (1394 connectivity) cables, and the appropriate port. The wireless connection will operate under any of the various known wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols or systems currently existing or to be developed for wirelessly transmitting data.

Figure 4:
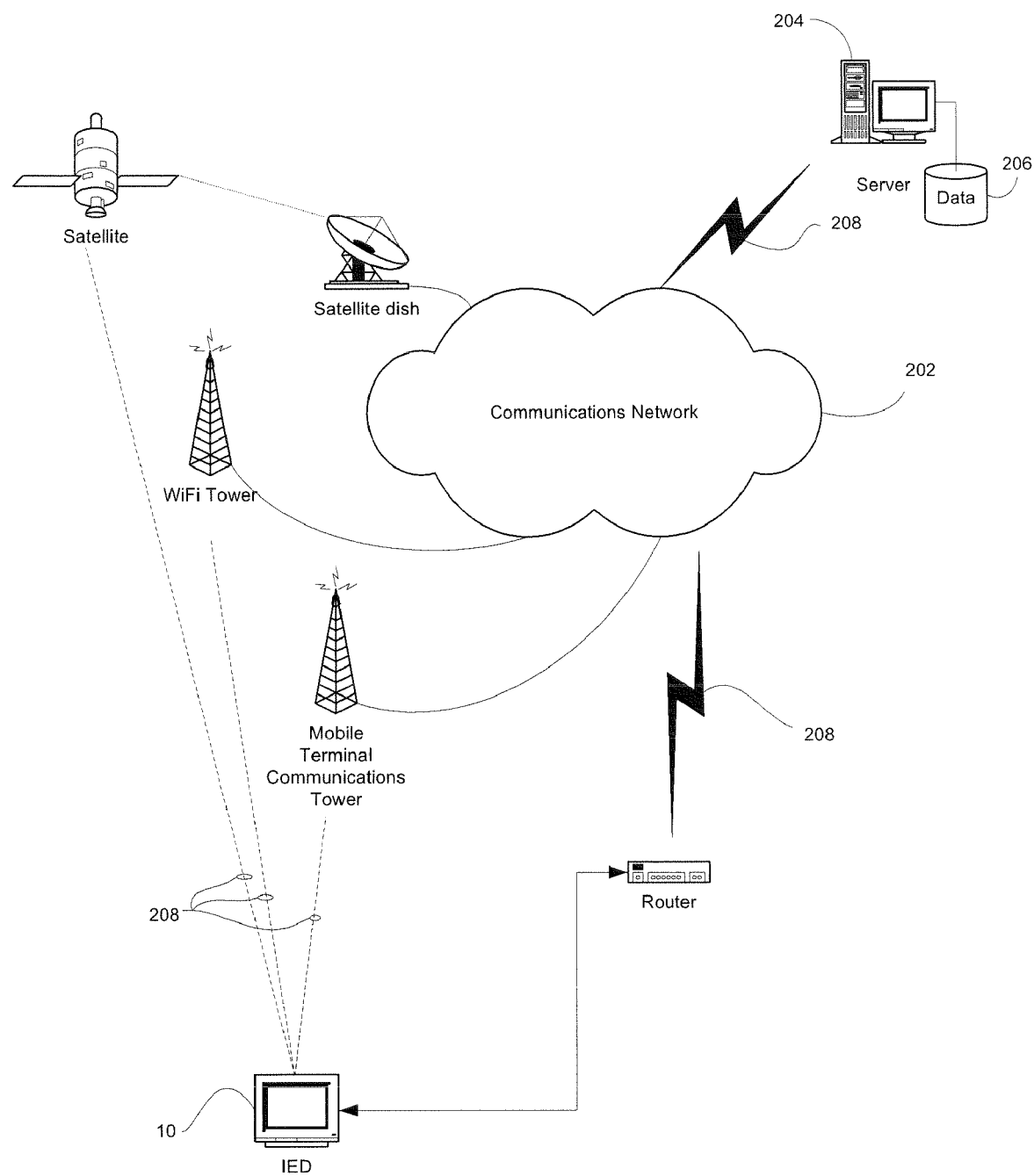
FIG. 4 is a system employing an intelligent electronic device in accordance with an embodiment of the present disclosure.

Referring to FIG. 4, The IED 10 will communicate to a server 204 via a communication network 202. The IED 10 and server 204 may be connected to the communications network 202, e.g., the Internet, by any known means, for example, a hardwired or wireless connection 208, such as dial-up, hardwired, cable, DSL, satellite, cellular, PCS, wireless transmission (e.g., 802.11a/b/g), etc. It is to be appreciated that the network 202 may be a local area network (LAN), wide area network (WAN), the Internet or any known network that couples a plurality of computers to enable various modes of communication via network messages. Furthermore, the server 204 will communicate using the various protocols such as Transmission Control Protocol/Internet Protocol (TCP/IP), File Transfer Protocol (FTP), Hypertext Transfer Protocol (HTTP), etc. and secure protocols such as Internet Protocol Security Protocol (IPSec), Point-to-Point Tunneling Protocol (PPTP), Secure Sockets Layer (SSL) Protocol, etc. The server 204 will further include a storage medium 206 for storing a database of instructional videos, operating manuals, etc., the details of which will be described in detail below.

In this embodiment, the digital audio and/or video files, e.g., instruction files, may be recorded on a remote server 204 and downloaded to the IED 10 via the communication device 34 over a network, e.g., the Internet. In one embodiment, the server 204 includes a database 206 of predetermined instruction files which may be downloaded to the IED 10 and stored in the memory 28 upon an event command issued by a user, on a schedule or by triggered by the IED 10. In another embodiment, upon each detection of an event, the IED 10 will transmit to the server 204 an event code and the server 204 will return an instruction file associated to the event code. In this embodiment, the instruction files will be maintained in one location ensuring all available IEDs 10 in a network will access the most up-to-date instructions It is to be appreciated that any known or to be developed digital audio and/or visual format may be employed in the IED of the present disclosure, e.g., MP3, WMA (Windows Media Audio), WAV, Real Audio, MIDI, etc. Furthermore, the remote server 204 will include a plurality of digital file converters for converting the digital files in database 206 from any available format to a format compatible with the IED.

In a further embodiment, microphone 106 and speaker 24 are further coupled to the communication device 34 for enabling voice communication from the IED to a remote location. In one embodiment, the communication device 34 will enable voice communications with VoIP (Voice over Internet Protocol) or may include a mobile communications module operating on CDMA, PCS, GSM or any other known wireless communication technology.

It is to be appreciated that the communication device 34 may include a single integrated circuit chip to perform data transfer and voice communications or a single module including a separate data transfer chip, e.g., a WiFi transceiver, and a separate voice communication chip, e.g., a CDMA chip. In one embodiment, the communication device 34 will operate on the wireless GPRS (General Packet Radio Service) data protocol or a 3G protocol such as W-CDMA, CDMA2000 and TD-SCDMA. Both the GPRS and 3G protocols have the ability to carry both voice and data over the same service.

In this embodiment, when an event is detected, an operator at the location of the IED 10 may communicate with a remote operator, e.g., a technical support operator, for facilitating the rectification of the event. The operator at the IED 10 will have a two-way communication with the technical support operator in an attempt to troubleshoot the event.

It is to be understood that the present disclosure may be implemented in various forms of hardware, software, firmware, special purpose processors, or a combination thereof. The IED also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

In a further embodiment, the circuitry for reducing the burden of a current transformer and the current transformer itself are disposed in a housing configured as a self-contained current sensor. In this embodiment, the output of the current sensor will be highly accurate and will required no additional circuitry in the meter making it highly desirable for existing metering installations.

Although the disclosure herein has been described with reference to particular illustrative embodiments, it is to be understood that these embodiments are merely illustrative of the principles and applications of the present disclosure. Therefore numerous modifications may be made to the illustrative embodiments and other arrangements may be devised without departing from the spirit and scope of the present disclosure, which is defined by the appended claims.

Furthermore, although the foregoing text sets forth a detailed description of numerous embodiments, it should be understood that the legal scope of the invention is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

What is claimed is:

1. A current sensor comprising:
a transformer including a primary winding configured for sensing a current delivered to a load and a secondary winding configured for outputting a scaled current via first and second leads;
an amplification circuit configured for variably amplifying the scaled output current and maintaining the output of the secondary winding at near zero voltage, wherein the amplification circuit includes:
an operational amplifier having a negative input and a positive input, the negative input and positive input being directly and physically connected to the first and second leads of the secondary winding, respectively; and
a variable feedback resistance coupled across the negative input of the operational amplifier and an output of the operational amplifier for variably amplifying the scaled output current; and
at least one processor that generates a control signal for controlling the variable feedback resistance based on a predetermined threshold of the output of the operational amplifier.

2. The current sensor of claim 1, wherein the variable feedback resistance includes a first resistor in parallel across the negative input of the operational amplifier and an output of the operational amplifier, a second resistor in parallel across the negative input of the operational amplifier and the output of the operational amplifier and at least one switch for selectively coupling the first resistor or the second resistor across the operational amplifier.

3. The current sensor of claim 2, wherein the at least one switch is a semiconductor analog switch.

4. The current sensor of claim 2, wherein an output signal (Vout) of the amplification circuit is $$Vout = Rfb * Ipr / Rct$$

where Rfb is the variable feedback resistance, Ipr is the current delivered to the load and Rct is a transfer ratio of the transformer.

5. The current sensor of claim 1, wherein the variable feedback resistance is a single variable resistor configured to be adjusted to any one of a plurality of resistor values.

6. An intelligent electronic device comprising:
a transformer including a primary winding configured for sensing a current delivered to a load and a secondary winding configured for outputting a scaled current via first and second leads;
an amplification circuit configured for variably amplifying the scaled output current and maintaining the output of the secondary winding at near zero voltage, wherein the amplification circuit includes:

an operational amplifier having a negative input and a positive input, the negative input and positive input being directly and physically connected to the first and second leads of the secondary winding, respectively; and a variable feedback resistance coupled across the negative input of the operational amplifier and an output of the operational amplifier for variably amplifying the scaled output current;

at least one analog-to-digital converter configured for receiving an amplified output and converting the amplified output to a digital signal; and at least one processor configured to receive the digital signal and determine a value for the current delivered to the load and generates a control signal for controlling the variable feedback resistance based on a predetermined threshold of the output of the operational amplifier.

7. The intelligent electronic device of claim 4, wherein the variable feedback resistance includes a first resistor in parallel across the negative input of the operational amplifier and an output of the operational amplifier, a second resistor in parallel across the negative input of the operational amplifier and the output of the operational amplifier and at least one switch for selectively coupling the first resistor or the second resistor across the operational amplifier.

8. The intelligent electronic device of claim 7, wherein the at least one processor is configured to monitor an output of the operational amplifier and, if the output of the operational amplifier is less than a predetermined threshold, to switch between the at least one first resistor and the at least one second resistor to provide amplification of the output of the operational amplifier.

9. The intelligent electronic device of claim 6, wherein an output signal (Vout) of the amplification circuit is $$Vout=Rfb*Ipr/Rct$$

Where Rfb is the variable feedback resistance, Ipr is the current delivered to the load and Rct is a transfer ratio of the transformer.

10. The intelligent electronic device of claim 6, wherein the at least one processor is further configured to determine power delivered to the load based on the determined value for the current delivered to the load.

11. The intelligent electronic device of claim 10, wherein the transformer, the amplification circuit, the at least one analog to digital converter and at least one processor are disposed in a socket meter form.

12. The intelligent electronic device of claim 10, wherein the transformer, the amplification circuit, the at least one analog to digital converter and at least one processor are disposed in a panel mounted meter form.

13. The intelligent electronic device of claim 10, wherein the transformer, the amplification circuit, the at least one analog to digital converter and at least one processor are disposed in a switchboard meter form.

14. A self-contained current sensor comprising:

a housing;

a transformer disposed in the housing, the transformer including a primary winding configured for sensing a current delivered to a load and a secondary winding configured for outputting a scaled current via first and second leads;

an amplification circuit disposed in the housing and configured for variably amplifying the scaled output current and maintaining the output of the secondary winding at near zero voltage, wherein the amplification circuit includes:

an operational amplifier having a negative input and a positive input, the negative input and positive input being physically and directly connected to the first and second leads of the secondary winding, respectively; and a variable feedback resistance coupled across the negative input of the operational amplifier and an output of the operational amplifier for variably amplifying the scaled output current; and at least one processor disposed in the housing that generates a control signal for controlling the variable feedback resistance based on a predetermined threshold of the output of the operational amplifier.

15. The self-contained current sensor of claim 14, wherein the variable feedback resistance is a single variable resistor configured to be adjusted to any one of a plurality of resistor values.

16. The self-contained current sensor of claim 14, wherein the variable feedback resistance includes a first resistor in parallel across the negative input of the operational amplifier and an output of the operational amplifier, a second resistor in parallel across the negative input of the operational amplifier and the output of the operational amplifier and at least one switch for selectively coupling the first resistor or the second resistor across the operational amplifier.

17. The self-contained current sensor of claim 16, wherein the at least one switch is a semiconductor analog switch.

* * * * *